(12) United States Patent
Maruyama et al.

(10) Patent No.: US 6,272,049 B1
(45) Date of Patent: Aug. 7, 2001

(54) NON-VOLATILE SEMICONDUCTOR MEMORY DEVICE HAVING INCREASED OPERATING SPEED

(75) Inventors: Takafumi Maruyama; Makoto Kojima, both of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/570,438

(22) Filed: May 12, 2000

(30) Foreign Application Priority Data

May 12, 1999 (JP) .................................................. 11-130796

(51) Int. Cl.[7] .................................................. G11C 16/04
(52) U.S. Cl. ................................ 365/185.24; 365/185.25; 365/185.26
(58) Field of Search ......................... 365/185.24, 185.25, 365/185.26, 185.29, 185.2, 185.21, 185.22

(56) References Cited

U.S. PATENT DOCUMENTS

| 5,010,518 | 4/1991 | Toda . | |
|---|---|---|---|
| 5,218,566 | 6/1993 | Papaliolios . | |
| 5,265,059 | * 11/1993 | Wells et al. | 365/204 |
| 5,446,690 | * 8/1995 | Tanaka et al. | 365/185 |
| 5,771,346 | * 6/1998 | Norman et al. | 395/183.18 |
| 5,828,615 | 10/1998 | Mukunoki et al. . | |
| 5,953,277 | 9/1999 | Mukunoki et al. . | |
| 6,101,123 | * 8/2000 | Kato et al. | 365/185.11 |

* cited by examiner

Primary Examiner—Trong Phan
Assistant Examiner—Thong Le
(74) Attorney, Agent, or Firm—McDermott, Will & Emery

(57) ABSTRACT

In order to read a data stored in a given memory cell, two dummy cells are provided, one of which is set to an erase state and the other to a program state. The threshold voltage of each cell attained in the program state is higher than the threshold voltage attained in the erase state and is lower than a maximum read voltage applied between a control gate and a source. Bit lines connected to the drains of the dummy cells are mutually connected through an equalizing switch for generating a reference potential at an intermediate level in a read cycle. The potential of a bit line connected to the drain of the memory cell and the generated reference potential are compared by a differential sense amplifier, so as to sense the state of the memory cell. In this manner, the invention provides a flash memory in which a program operation completed in short time and an accurate read operation can be consistent with each other.

19 Claims, 3 Drawing Sheets

NON-VOLATILE SEMICONDUCTOR MEMORY DEVICE HAVING INCREASED OPERATING SPEED

BACKGROUND OF THE INVENTION

The present invention relates to a non-volatile semiconductor memory device, and more particularly, it relates to an electrically erasable and programmable read only memory (EEPROM).

A flash EEPROM (flash memory) including a plurality of non-volatile memory cells each having a control gate, a floating gate, a drain and a source is conventionally known, in which data stored in each predetermined block can be erased in a batch manner.

FIG. 1 shows a distribution of the threshold voltage Vth of memory cells included in the conventional flash memory. In an erase cycle, electrons stored in the floating gate of each memory cell are released, and as a result, each memory cell has a low threshold voltage. The state of the memory cell thus holding a data "0" is herein designated as an erase state or a 0 (zero) state. In a program cycle, electrons are stored in the floating gate of a selected memory cell alone by using mechanism of hot electron injection. The memory cell storing the electrons in its floating gate has a high threshold voltage. The state of the memory cell thus holding a data "1" is herein designated as a program state or a 1 (one) state. In a read cycle, with a positive low potential applied to the drain and a ground potential applied to the source of a memory cell to be read, a predetermined read voltage Vgs is applied between the control gate and the source of the memory cell. When the maximum value of the read voltage, namely, the maximum read voltage, is indicated as Vgsmax, a program operation of the conventional flash memory is conducted over a sufficient time period until all the memory cells to be transit from the 0 state to the 1 state attain a threshold voltage higher than the voltage Vgsmax.

On the other hand, a differential sensing type flash memory with rapid read performance is known. This flash memory includes, in order to read stored data from one memory cell whose state is set in accordance with FIG. 1, one dummy cell having the same configuration as the memory cell and always set to the 0 state, and one differential sense amplifier. The drain of the memory cell is connected to the differential sense amplifier through a first bit line, and the drain of the dummy cell is connected to the differential sense amplifier through a second bit line. The first and second bit lines are set to a predetermined precharge potential VPC at the initial stage of a read cycle.

In the case where the memory cell is in the 0 state, when the read voltage Vgs is applied between the control gate and the source, a drain current is drained from the first bit line, so as to lower the potential of the first bit line. In the case where the memory cell is in the 1 state, even when the read voltage Vgs is applied between the control gate and the source, the memory cell never draws a drain current from the first bit line, and hence, the potential of the first bit line is kept at the precharge potential VPC. On the other hand, when the read voltage Vgs is applied between the control gate and the source of the dummy cell, a drain current is drained from the second bit line, so as to lower the potential of the second bit line. The channel width and/or channel length of the dummy cell is, however, adjusted so that the drain current of the dummy cell can be a half of the drain current of the memory cell set to the 0 state. Accordingly, a reference potential Vref generated by the dummy cell on the second bit line is higher than the potential of the first bit line attained when the memory cell is in the 0 state and is lower than the potential VPC of the first bit line attained when the memory cell is in the 1 state. The differential sense amplifier compares the potentials of the first and second bit lines, thereby accurately sensing the state of the memory cell.

In the conventional flash memory, a program operation is not completed until all the memory cells to be transit from the 0 state to the 1 state attain a threshold voltage higher than the maximum read voltage Vgsmax in order to accurately read a data "1" stored in the memory cell. Accordingly, it takes a disadvantageously long period of time to conduct a program operation (as shown in FIG. 1).

FIG. 2 shows a problem occurring in a read cycle of the conventional differential sensing type flash memory. Specifically, the problem is that when the read voltage Vgs is unexpectedly increased as a result of increase of a supply voltage, a data "1" stored in a memory cell cannot be accurately read. As shown with a broken line in FIG. 2, the potential of a bit line connected to a memory cell set to the 1 state to have a threshold voltage higher than the read voltage is kept at the potential VPC in a read cycle. When the read voltage Vgs is higher than the threshold voltage Vth of the memory cell in the 1 state, namely, when Vgs>Vth, this memory cell in the 1 state draws a drain current from the bit line so as to lower the potential of the bit line. On the other hand, the reference voltage Vref generated by a dummy cell set to the 0 state does not depend upon the read voltage Vgs. Accordingly, as is shown in FIG. 2, when Vgs>Vth, the potential of the bit line lowered by the memory cell in the 1 state may be lower than the reference potential Vref, and in such a case, a read error occurs. A similar read error can occur when the threshold voltage of the memory cell in the 1 state is set to be lower than the maximum read voltage Vgsmax in order to solve the problem of the long time required for a program operation.

SUMMARY OF THE INVENTION

An object of the invention is providing a non-volatile semiconductor memory device in which a program operation completed in short time and an accurate read operation can be consistent with each other.

In order to achieve the object, according to the invention, the threshold voltage of a memory cell in a program state (1 state) is reduced, and a reference potential used in a read cycle is generated by connecting a bit line connected to a dummy cell in an erase state (0 state) to another bit line connected to another dummy cell in the program state (1 state).

Specifically, the non-volatile semiconductor memory device of this invention comprises first, second and third memory cells, each of which has a control gate, a floating gate, a drain and a source, and is set either to an erase state having a low threshold voltage or to a program state where more electrons than in the erase state are stored in the floating gate for attaining a threshold voltage higher than the threshold voltage attained in the erase state, the threshold voltage attained in the program state being lower than a maximum read voltage applied between the control gate and the source; a first bit line connected to the drain of the first memory cell; a second bit line connected to the drain of the second memory cell; a third bit line connected to the drain of the third memory cell; means for setting one of the second and third memory cells to the erase state and the other to the program state; means for connecting the second bit line to the third bit line in a given read cycle; means for setting the first, second and third bit lines to a predetermined precharge potential at an initial stage of the read cycle; and sensing means for sensing a state of the first memory cell in the read cycle by comparing a potential of the first bit line that is lowered from the precharge potential by a drain current drained from the first bit line by the first memory cell with a potential of the second and third bit lines that is lowered from the precharge potential by a drain current drained from the second and third bit lines, connected to each other, by the second and third memory cells.

It is known, in a flash memory, that the interface characteristic of a gate oxide film is largely degraded through repeated erase/program operations of memory cells. Accordingly, in order to uniform the extent of degradation of the first, second and third memory cells, the number of times of repeating erase/program operations conducted on these memory cells should be equalized as far as possible. In this manner, an optimal reference potential can be always provided.

DETAILED DESCRIPTION OF THE INVENTION

Figure 1:
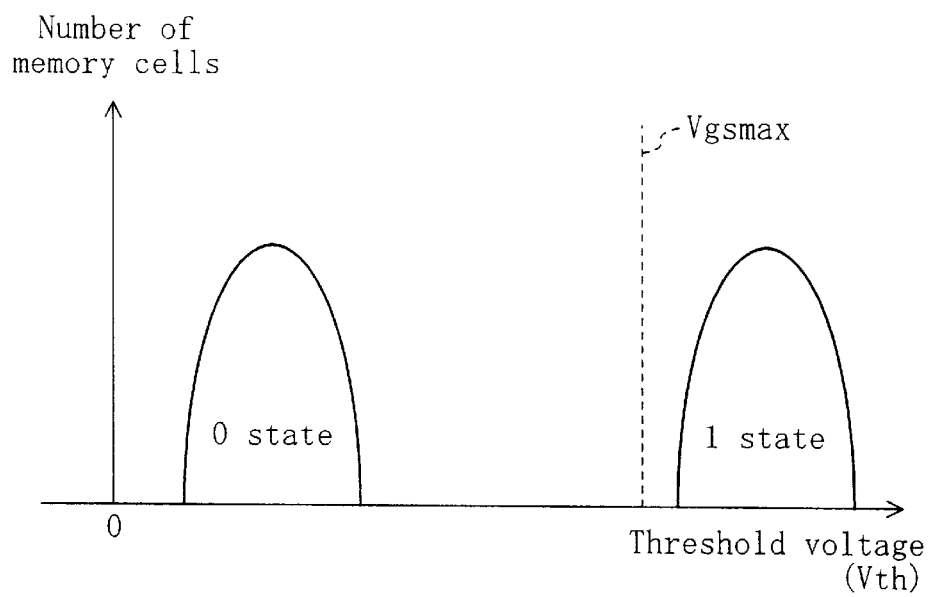
FIG. 1 is a diagram of a distribution of the threshold voltage of memory cells included in a conventional flash memory.
Figure 2:
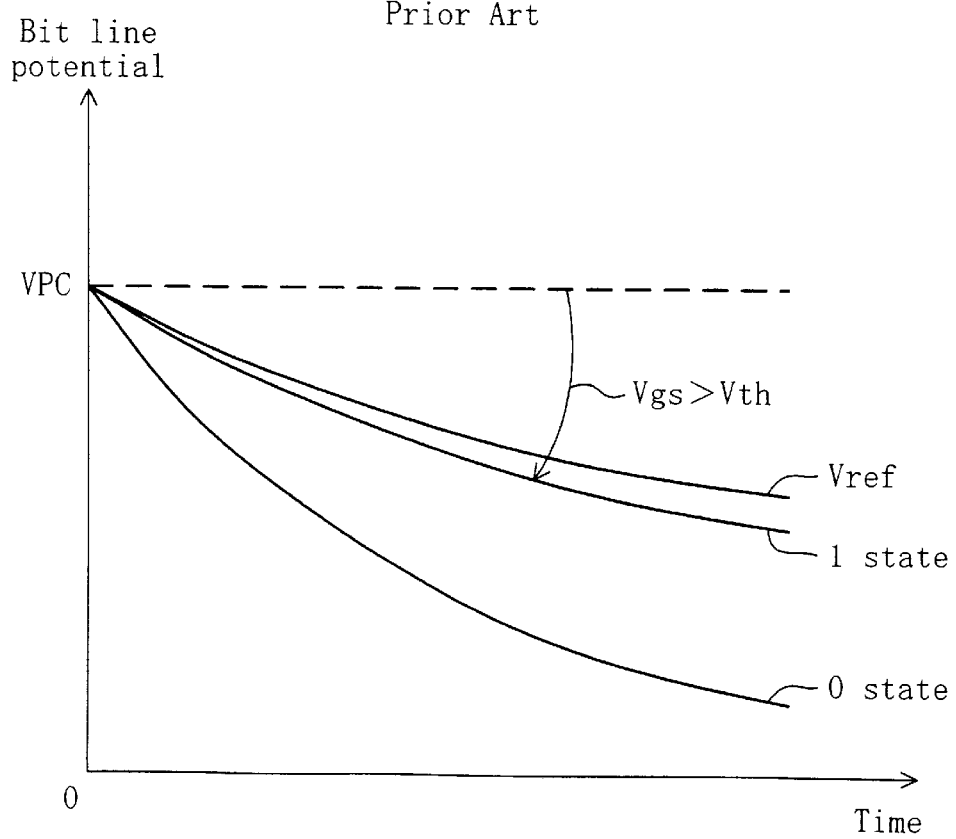
FIG. 2 is a diagram for showing change of the potential of a bit line in a read cycle of the conventional flash memory.
Figure 3:
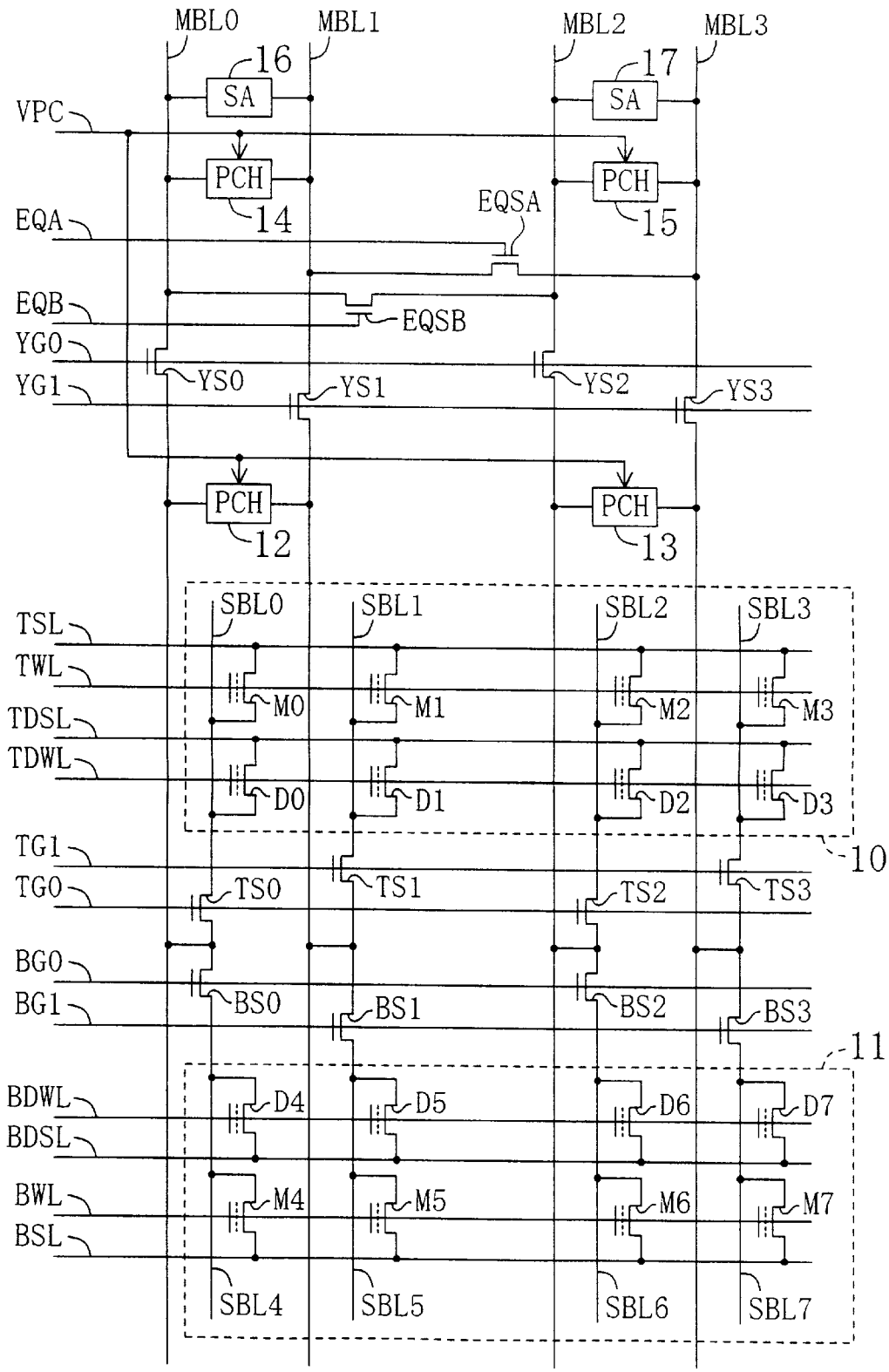
FIG. 3 is a block diagram for showing an exemplified configuration of a flash memory of this invention.

FIG. 3 shows an exemplified configuration of a flash memory according to this invention. The flash memory of FIG. 3 includes a top array 10, a bottom array 11, four main bit lines MBL0 through BML3, eight sub bit lines SBL0 through SBL7, and eight bit line selecting switches TS0 through TS3 and BS0 through BS3.

The top array 10 includes memory cells M0 through M3, dummy cells D0 through D3 and other memory cells not shown. Each of these cells is a non-volatile memory cell including a control gate, a floating gate, a drain and a source. The control gate of each of the memory cells M0 through M3 is connected to a word line TWL, and the source of each memory cell is connected to a source line TSL. The control gate of each of the dummy cells D0 through D3 is connected to a dummy word line TDWL, and the source of each dummy cell is connected to a dummy source line TDSL. The drain of each of the memory cell M0 and the dummy cell D0 is connected to the sub bit line SBL0, which is connected to the main bit line MBL0 through the bit line selecting switch TS0. The drain of each of the memory cell M1 and the dummy cell D1 is connected to the sub bit line SBL1, which is connected to the main bit line MBL1 through the bit line selecting switch TS1. The drain of each of the memory cell M2 and the dummy cell D2 is connected to the sub bit line SBL2, which is connected to the main bit line MBL2 through the bit line selecting switch TS2. The drain of each of the memory cell M3 and the dummy cell D3 is connected to the sub bit line SBL3, which is connected to the main bit line MBL3 through the bit line selecting switch TS3. A signal TG0 is supplied to the gate of a transistor constituting each of the bit line selecting switches TS0 and TS2, and a signal TG1 is supplied to the gate of a transistor constituting each of the bit line selecting switches TS1 and TS3.

The bottom array 11 includes memory cells M4 through M7, dummy cells D4 through D7 and other memory cells not shown. Each of these cells is a non-volatile memory cell including a control gate, a floating gate, a drain and a source. The control gate of each of the memory cells M4 through M7 is connected to a word line BWL, and the source of each memory cell is connected to a source line BSL. The control gate of each of the dummy cells D4 through D7 is connected to a dummy word line BDWL, and the source of each dummy cell is connected to a dummy source line BDSL. The drain of each of the memory cell M4 and the dummy cell D4 is connected to the sub bit line SBL4, which is connected to the main bit line MBL0 through the bit line selecting switch BS0. The drain of each of the memory cell M5 and the dummy cell D5 is connected to the sub bit line SBL5, which is connected to the main bit line MBL1 through the bit line selecting switch BS1. The drain of each of the memory cell M6 and the dummy cell D6 is connected to the sub bit line SBL6, which is connected to the main bit line MBL2 through the bit line selecting switch BS2. The drain of each of the memory cell M7 and the dummy cell D7 is connected to the sub bit line SBL7, which is connected to the main bit line MBL3 through the bit line selecting switch BS3. A signal BG0 is supplied to the gate of a transistor constituting each of the bit line selecting switches BS0 and BS2, and a signal BG1 is supplied to the gate of a transistor constituting each of the bit line selecting switches BS1 and BS3.

On the main bit lines MBL0 through MBL3, corresponding column gates YS0 through YS3 are provided, respectively. A signal YG0 is supplied to the gate of a transistor constituting each of the column gates YS0 and YS2, and a signal YG1 is supplied to the gate of a transistor constituting each of the column gates YS1 and YS3. Precharge circuits 12 and 13 are respectively provided in order to set, to a predetermined precharge potential VPC, the potential of inside portions of the main bit lines MBL0 and MBL1 (portions below the column gates YS0 and YS1 in FIG. 3) and the potential of inside portions of the main bit lines MBL2 and MBL3 (portions below the column gates YS2 and YS3 in FIG. 3). Also, precharge circuits 14 and 15 are respectively provided in order to set, to the precharge potential VPC, the potential of outside portions of the main bit lines MBL0 and MBL1 (portions above the column gates YS0 and YS1 in FIG. 3) and the potential of outside portions of the main bit lines MBL2 and MBL3 (portions above the column gates YS2 and YS3 in FIG. 3). An equalizing switch EQSA is disposed between the outside portions of the main bit lines MBL1 and MBL3 for connecting these main bit lines to each other in a read cycle. An equalizing switch EQSB is disposed between the outside portions of the main bit lines MBL0 and MBL2 for connecting these main bit lines to each other in a read cycle. A signal EQA is supplied to the gate of a transistor constituting the equalizing switch EQSA, and a signal EQB is supplied to the gate of a transistor constituting the equalizing switch EQSB. A reference numeral 16 denotes a differential sense amplifier connected to the outside portions of the main bit lines MBL0 and MBL1, and a reference numeral 17 denotes a differential sense amplifier connected to the outside portions of the main bit lines MBL2 and MBL3. The memory cells M0 through M7 and the dummy cells D0 through D7 are formed in the same size at the same pitch through substantially the same fabrication procedures.

Figure 4:
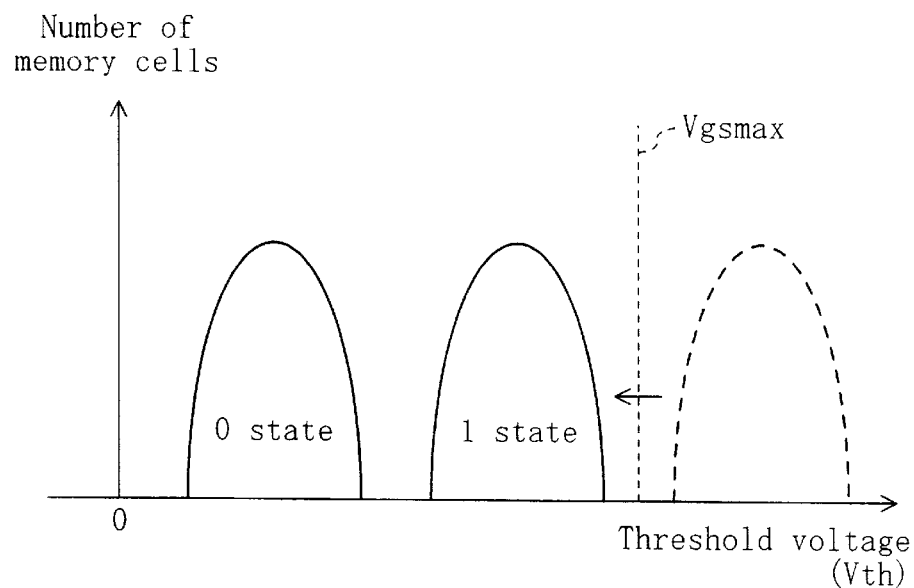
FIG. 4 is a diagram of a distribution of the threshold voltage of memory cells included in the flash memory of FIG. 3.

FIG. 4 shows a distribution of the threshold voltage Vth of the memory cells (including the memory cells M0 through M7 and the dummy cells D0 through D7) of the flash memory of FIG. 3. In an erase cycle of the top array 10, a predetermined potential is supplied to each of the word lines TWL and TDWL and the source lines TSL and TDSL, so as to release electrons stored in the floating gate of each of the memory cells M0 through M3 and the dummy cells D0 through D3. As a result, each of the memory cells is set to the 0 state having a low threshold voltage. In an erase cycle of the bottom array 11, a predetermined potential is supplied to each of the word lines BWL and BDWL and the source lines BSL and BDSL, so as to set each of the memory cells M4 through M7 and the dummy cells D4 through D7 to the 0 state having a low threshold voltage. Assuming, for example, that a data "1" is desired to be programmed in the memory cell M0, a predetermined potential is supplied to each of the word line TWL and the source line TSL, with the bit line selecting switch TS0 and the column gate YS0 closed, a program circuit (not shown) connected to the main bit line MBL0 supplying a predetermined potential to the bit lines MBL0 and SBL0, so that a program operation can be conducted. As a result, electrons are stored in the floating gate of the memory cell M0 due to the mechanism of hot electron injection, and the memory cell M0 undergoes a transition from the 0 state to the 1 state having a higher threshold voltage. The threshold voltage attained in the 1 state is set, as is shown in FIG. 4, to a value smaller than the maximum value of a read voltage applied between the control gate and the source in a read cycle, namely, the maximum read voltage Vgsmax. The threshold voltage attained in the 1 state is similarly set when a data "1" is to be programmed in another memory cell (or dummy cell). In other words, in the flash memory of FIG. 3, the threshold voltage of a memory cell attained in the 1 state is largely lowered as compared with that of the conventional technique shown with a coarse broken line in FIG. 4. Accordingly, the time required for a program operation can be largely shortened than in the conventional technique. In an erase or program cycle, the equalizing switches EQSA and EQSB are opened.

Next, a read cycle of the flash memory of FIG. 3 will be described. At the initial stage of each read cycle, the precharge circuits 12 through 15 respectively precharge the main bit lines MBL0 through MBL3 to the precharge potential VPC, and are turned off after the main bit lines are sufficiently charged to the potential VPC. During this precharge, for example, all the bit line selecting switches TS0 through TS3 and BS0 through BS3, the column gates YS0 through YS3 and the equalizing switches EQSA and EQSB are closed.

In the configuration of FIG. 3, one of the dummy cells D0 and D2 is previously set to the 0 state and the other to the 1 state. The dummy cells D0 and D2 are used for generating a reference potential used in a read cycle or the memory cells M5 and M7. At this point, the bit line selecting switches TS0, BS1, TS2 and BS3, the column gates YS0 through YS3 and the equalizing switch EQSB are closed, while the bit line selecting switches BS0, TS1, BS2 and TS3 and the equalizing switch EQSA are opened. Then, the predetermined read voltage Vgs is applied to the control gates of the selected memory cells M5 and M7. Similarly, the read voltage Vgs is applied to the control gates of the dummy cells D0 and D2 for generating the reference potential. The differential sense amplifier 16 conducts an amplifying operation for sensing a state of the memory cell M5 after waiting until a difference between the potential of the main bit line MBL1, which is lowered from the precharge potential VPC by a drain current drained from the main bit line MBL1 by the memory cell M5, and the potential of the main bit lines MBL0 and MBL2, which is lowered from the precharge potential VPC by a drain current drained from the connected main bit lines MBL0 and MBL2 by the dummy cells D0 and D2, reaches a level detectable by the differential sense amplifier 16. The differential sense amplifier 17 conducts an amplifying operation for sensing a state of the memory cell M7 after waiting until a difference between the potential of the main bit line MBL3, which is lowered from the precharge potential VPC by a drain current drained from the main bit line MBL3 by the memory cell M7, and the potential of the main bit lines MBL0 and MBL2, which is lowered from the precharge potential VPC by a drain current drained from the connected main bit lines MBL0 and MBL2 by the dummy cells D0 and D2, reaches a level detectable by the differential sense amplifier 17. During these amplifying operations, the column gates YS0 through YS3 and the equalizing switch EQSB are opened, so as to allow the differential sense amplifiers 16 and 17 to generate a potential difference between the disconnected main bit lines MBL0 and MBL2.

Furthermore, one of the dummy cells D1 and D3 is previously set to the 0 state and the other to the 1 state. The dummy cells D1 and D3 are used for generating a reference potential used in a read cycle for the memory cells M4 and M6. At this point, the bit line selecting switches BS0, TS1, BS2 and TS3, the column gates YS0 through YS3 and the equalizing switch EQSA are closed, while the bit line selecting switches TS0, BS1, TS2 and BS3 and the equalizing switch EQSB are opened. Then, the predetermined read voltage Vgs is applied to the control gates of the selected memory cells M4 and M6. Similarly, the read voltage Vgs is applied to the control gates of the dummy cells D1 and D3 for generating the reference potential. The differential sense amplifier 16 conducts an amplifying operation for sensing a state of the memory cell M4 after waiting until a difference between the potential of the main bit line MBL0, which is lowered from the precharge potential VPC by a drain current drained from the main bit line MBL0 by the memory cell M4, and the potential of the main bit lines MBL1 and MBL3, which is lowered from the precharge potential VPC by a drain current drained from the connected main bit lines MBL1 and MBL3 by the dummy cells D1 and D3, reaches a level detectable by the differential sense amplifier 16. The differential sense amplifier 17 conducts an amplifying operation for sensing a state of the memory cell M6 after waiting until a difference between the potential of the main bit line MBL2, which is lowered from the precharge potential VPC by a drain current drained from the main bit line MBL2 by the memory cell M6, and the potential of the main bit lines MBL1 and MBL3, which is lowered from the precharge potential VPC by a drain current drained from the connected main bit lines MBL1 and MBL3 by the dummy cells D1 and D3, reaches a level detectable by the differential sense amplifier 17. During these amplifying operations, the column gates YS0 through YS3 and the equalizing switch EQSA are opened, so as to allow the differential sense amplifiers 16 and 17 to generate a potential difference between the disconnected main bit lines MBL1 and MBL3.

One of the dummy cells D4 and D6 is previously set to the 0 state and the other to the 1 state. The dummy cells D4 and D6 are used for generating a reference potential used in a read cycle for the memory cells M1 and M3. At this point, the bit line selecting switches BS0, TS1, BS2 and TS3, the column gates YS0 through YS3 and the equalizing switch EQSB are closed, while the bit line selecting switches TS0, BS1, TS2 and BS3 and the equalizing switch EQSA are opened. Then, the predetermined read voltage Vgs is applied to the control gates of the selected memory cells M1 and M3. Similarly, the read voltage Vgs is applied to the control gates of the dummy cells D4 and D6 for generating the reference potential. The differential sense amplifier 16 conducts an amplifying operation for sensing a state of the memory cell M1 after waiting until a difference between the potential of the main bit line MBL1, which is lowered from the precharge potential VPC by a drain current drained from the main bit line MBL1 by the memory cell M1, and the potential of the main bit lines MBL0 and MBL2, which is lowered from the precharge potential VPC by a drain current drained from the connected main bit lines MBL0 and MBL2 by the dummy cells D4 and D6, reaches a level detectable by the differential sense amplifier 16. The differential sense amplifier 17 conducts an amplifying operation for sensing a state of the memory cell M3 after waiting until a difference between the potential of the main bit line MBL3, which is lowered from the precharge potential VPC by a drain current drained from the main bit line MBL3 by the memory cell M3, and the potential of the main bit lines MBL0 and MBL2, which is lowered from the precharge potential VPC by a drain current drained from the connected main bit lines MBL0 and MBL2 by the dummy cells D4 and D6, reaches a level detectable by the differential sense amplifier 17. During these amplifying operations, the column gates YS0 through YS3 and the equalizing switch EQSB are opened, so as to allow the differential sense amplifiers 16 and 17 to generate a potential difference between the disconnected main bit lines MBL0 and MBL2.

One of the dummy cells D5 and D7 is previously set to the 0 state and the other to the 1 state. The dummy cells D5 and D7 are used for generating a reference potential used in a read cycle for the memory cells M0 and M2. At this point, the bit line selecting switches TS0, BS1, TS2 and BS3, the column gates YS0 through YS3 and the equalizing switch EQSA are closed, while the bit line selecting switches BS0, TS1, BS2 and TS3 and the equalizing switch EQSB are opened. Then, the predetermined read voltage Vgs is applied to the control gates of the selected memory cells M0 and M2. Similarly, the read voltage Vgs is applied to the control gates of the dummy cells D5 and D7 for generating the reference potential. The differential sense amplifier 16 conducts an amplifying operation for sensing a state of the memory cell M0 after waiting until a difference between the potential of the main bit line MBL0, which is lowered from the precharge potential VPC by a drain current drained from the main bit line MBL0 by the memory cell M0, and the potential of the main bit lines MBL1 and MBL3, which is lowered from the precharge potential VPC by a drain current drained from the connected main bit lines MBL1 and MBL3 by the dummy cells D5 and D7, reaches a level detectable by the differential sense amplifier 16. The differential sense amplifier 17 conducts an amplifying operation for sensing a state of the memory cell M2 after waiting until a difference between the potential of the main bit line MBL2, which is lowered from the precharge potential VPC by a drain current drained from the main bit line MBL2 by the memory cell M2, and the potential of the main bit lines MBL1 and MBL3, which is lowered from the precharge potential VPC by a drain current drained from the connected main bit lines MBL1 and MBL3 by the dummy cells D5 and D7, reaches a level detectable by the differential sense amplifier 17. During these amplifying operations, the column gates YS0 through YS3 and the equalizing switch EQSA are opened, so as to allow the differential sense amplifiers 16 and 17 to generate a potential difference between the disconnected main bit lines MBL1 and MBL3.

Figure 5:
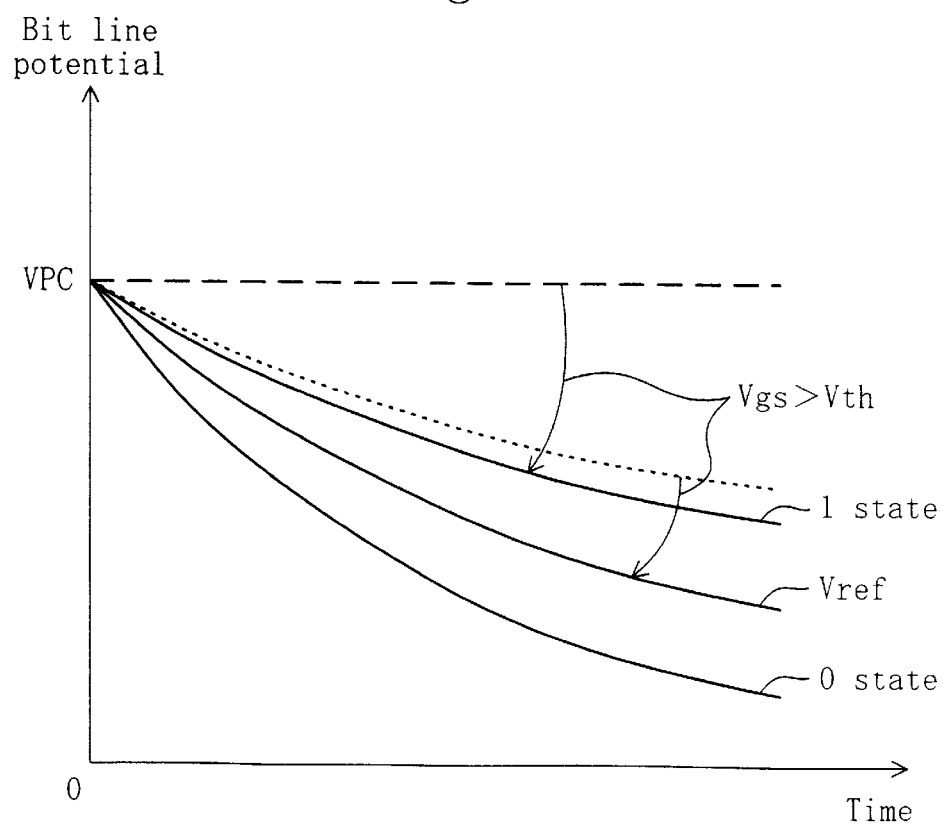
FIG. 5 is a diagram for showing change of the potential of a bit line in a read cycle of the flash memory of FIG. 3.

FIG. 5 shows change of the potential of a bit line in a read cycle of the flash memory of FIG. 3. Herein, description will be given on the assumption that the memory cell to be read is, for example, the memory cell M4. In a read cycle for the memory cell M4, with the bit line selecting switch BS0 and the column gate YS0 closed, a predetermined potential is supplied to each of the word line BWL, the source line BSL and the bit lines MBL0 and SBL4. As a result, the predetermined read voltage Vgs is applied between the control gate and the source of the memory cell M4. As described above, the reference potential Vref for reading data from the memory cell M4 is generated by the dummy cells D1 and D3 with the bit line selecting switches TS1 and TS3, the column gates YS1 and YS3 and the equalizing switch EQSA closed. For this purpose, a predetermined potential is supplied to each of the word line TDWL and the source line TDSL. Thus, the read voltage Vgs, the same as that applied to the memory cell M4, is applied between the control gate and the source of each of the dummy cells D1 and D3.

The memory cell M4 is in the 0 state or the 1 state. In the case where the memory cell M4 is in the 0 state, when the read voltage Vgs is applied between the control gate and the source of the memory cell M4, a large drain current is drained through the sub bit line SBL4 from the main bit line MBL0, resulting in largely lowering the potential of the main bit line MBL0. Also in the case where the memory cell M4 is in the 1 state, the potential of the main bit line MBL0 is not kept at the precharge potential VPC as is shown with a coarse broken line in FIG. 5 but is slightly lowered. This is because the memory cell M4 in the 1 state drains a small drain current from the main bit line MBL0 since the read voltage Vgs is higher than the threshold voltage Vth of the memory cell in the 1 state (Vgs>Vth as shown in FIG. 4).

On the other hand, when the read voltage Vgs is applied between the control gate and the source of each of the dummy cells D1 and D3, these dummy cells drain drain currents from the main bit lines MBL1 and MBL3, respectively. Herein, it is assumed that the dummy cell D1 is in the 0 state and that the dummy cell D3 is in the 1 state. In this case, the current drained from the main bit line MBL1 by the dummy cell D1 corresponds to the current drained from the main bit line MBL0 by the memory cell M4 in the 0 state. Furthermore, the current drained from the main bit line MBL3 by the dummy cell D3 corresponds the current drained from the main bit line MBL0 by the memory cell M4 in the 1 state. Since the main bit lines MBL1 and MBL3 are mutually connected through the equalizing switch EQSA, the potential of the main bit lines MBL1 and MBL3, namely, the reference potential Vref, is not changed at a level higher than the potential of the main bit line MBL0 attained when the memory cell M4 is in the 1 state as shown with a fine broken line in FIG. 5 but is changed at an intermediate level between the potential of the main bit line MBL0 attained when the memory cell M4 is in the 0 state and the potential of the main bit line MBL0 attained when the memory cell M4 is in the 1 state. Accordingly, the differential sense amplifier 16 can accurately sense the state of the memory cell M4. It is preferable that the main bit lines MBL0 through MBL3 have a same load capacitance and the sub bit lines SBL0 through SBL7 have another same load capacitance. This feature is convenient, for example, for a bit line route extending from the differential amplifier 16 to the dummy cells D1 and D3, or a route MBL1+SBL1+MBL3+SBL3, to have a load capacitance just twice as large as that of a bit line route extending from the differential amplifier 16 to the memory cell M4, or a route MBL0+SBL4.

In this manner, in the flash memory of FIG. 3, a program operation completed in short time and an accurate read operation can be consistent with each other. In addition, an accurate read operation can be guaranteed even when the read voltage Vgs is unexpectedly increased due to increase of a supply voltage.

The dummy cells D1 and D3 are erased once in updating the state of the memory cell M4, so as to be set to, for example, a state the same as that previous to the erase again. Therefore, the extent of degradation of the memory cell M4 and the dummy cells D1 and D3 can be uniformed. In consideration that there is a difference between damage of a gate oxide film caused in an erase operation and damage thereof caused in a program operation, the dummy cells D1 and D3 are preferably once erased and set to be a state reverse to that previous to the erase in updating the state of the memory cell M4. In this manner, the extent of degradation of the dummy cells D1 and D3 can be uniformed. The same is true for another combination of the memory cell and the dummy cells. The configuration of the flash memory in which both the top array 10 and the bottom array 11 include dummy cells as is shown in FIG. 3 is useful in uniforming the extent of degradation of the cells. It is possible to exchange the roles of the memory cells and the dummy cells of FIG. 3 upon occasion.

In the aforementioned embodiment, even when the threshold voltage Vth of a memory cell in the program state is set to be higher than the maximum read voltage Vgsrmax applied between the control gate and the source, the reference voltage Vref can be accurately generated. As a result, even when the threshold voltages of the memory cells are varied depending upon the process conditions, or even when the voltage applied to a memory cell is varied, a stored data can be accurately read.

What is claimed is:

1. An electrically erasable and programmable non-volatile semiconductor memory device comprising:

first, second and third memory cells, each of which has a control gate, a floating gate, a drain and a source, and is set either to an erase state having a low threshold voltage or to a program state where more electrons than in said erase state are stored in the floating gate for attaining a threshold voltage higher than the threshold voltage attained in said erase state, the threshold voltage attained in said program state being lower than a maximum read voltage applied between the control gate and the source;

a first bit line connected to the drain of said first memory cell;

a second bit line connected to the drain of said second memory cell;

a third bit line connected to the drain of said third memory cell;

means for setting one of said second and third memory cells to said erase state and the other to said program state;

means for connecting said second bit line to said third bit line in a given read cycle;

means for setting said first, second and third bit lines to a predetermined precharge potential at an initial stage of said read cycle; and sensing means for sensing a state of said first memory cell in said read cycle by comparing a potential of said first bit line that is lowered from said precharge potential by a drain current drained from said first bit line by said first memory cell with a potential of said second and third bit lines, connected to each other, that is lowered from said precharge potential by a drain current drained from said second and third bit lines by said second and third memory cells.

2. The non-volatile semiconductor memory device of claim 1,
wherein said second and third bit lines, connected to each other, have a load capacitance twice as large as that of said first bit line.

3. The non-volatile semiconductor memory device of claim 1, further comprising means for disconnecting the drains of said first, second and third memory cells from said first, second and third bit lines.

4. The non-volatile semiconductor memory device of claim 1,
wherein said second and third memory cells are erased once to be set to a state the same as that previous to erase when the state of said first memory cell is updated.

5. The non-volatile semiconductor memory device of claim 1,
wherein said second and third memory cells are erased once to be set to a state reverse to that previous to erase when the state of said first memory cell is updated.

6. The non-volatile semiconductor memory device of claim 1, further comprising:

a fourth memory cell that includes a control gate, a floating gate, a drain and a source and is set either to an erase state having a low threshold voltage or to a program state where more electrons than in said erase state are stored in the floating gate for attaining a threshold voltage higher than the threshold voltage attained in said erase state, the threshold voltage attained in said program state being lower than a maximum read voltage applied between the control gate and the source;

a fourth bit line connected to the drain of said fourth memory cell and set to said precharge potential at the initial stage of said read cycle; and means for sensing a state of said fourth memory cell in said read cycle by comparing a potential of said fourth bit line that is lowered from said precharge potential by a drain current drained from said fourth bit line by said fourth memory cell with a potential of said second and third bit lines, connected to each other, that is lowered from said precharge potential by a drain current drained from said second and third bit lines by said second and third memory cells.

7. The non-volatile semiconductor memory device of claim 6,
wherein said second and third bit lines, connected to each other, have a load capacitance twice as large as that of said fourth bit line.

8. The non-volatile semiconductor memory device of claim 6, further comprising means for disconnecting said second bit line from said third bit line after sensing of states of said first and fourth memory cells has been started in said read cycle.

9. The non-volatile semiconductor memory device of claim 6, further comprising first and second arrays,
wherein said first and fourth memory cells are included in said first array and said second and third memory cells are included in said second array, and
said first array includes another plural memory cells for generating a reference potential used for sensing a state of each of another plural memory cells included in said second array in the same manner as that a reference potential used for sensing the states of said first and fourth memory cells is generated by said second and third memory cells.

10. The non-volatile semiconductor memory device of claim 6, further comprising:
   means for setting one of said first and fourth memory cells to said erase state and the other to said program state;
   means for connecting said first bit line to said fourth bit line in another read cycle;
   means for setting each of said first, second, third and fourth bit lines to said precharge potential at an initial stage of said another read cycle;
   means for sensing a state of said second memory cell in said another read cycle by comparing a potential of said second bit line that is lowered from said precharge potential by a drain current drained from said second bit line by said second memory cell with a potential of said first and fourth bit lines, connected to each other, that is lowered from said precharge potential by a drain current drained from said first and fourth bit lines by said first and fourth memory cells; and
   means for sensing a state of said third memory cell in said another read cycle by comparing a potential of said third bit line that is lowered from said precharge potential by a drain current drained from said third bit line by said third memory cell with a potential of said first and fourth bit lines, connected to each other, that is lowered from said precharge potential by a drain current drained from said first and fourth bit lines by said first and fourth memory cells.

11. The non-volatile semiconductor memory device of claim 10,
   wherein said first and fourth bit lines, connected to each other, have a load capacitance twice as large as those of said second bit line and said third bit line.

12. An electrically erasable and programmable non-volatile semiconductor memory device comprising:
   first, second and third memory cells, each of which has a control gate, a floating gate, a drain and a source, and is set either to an erase state having a low threshold voltage or to a program state where more electrons than in said erase state are stored in the floating gate for attaining a threshold voltage higher than the threshold voltage attained in said erase state;
   a first bit line connected to the drain of said first memory cell;
   a second bit line connected to the drain of said second memory cell;
   a third bit line connected to the drain of said third memory cell;
   means for setting one of said second and third memory cells to said erase state and the other to said program state;
   means for connecting said second bit line to said third bit line in a given read cycle;
   means for setting said first, second and third bit lines to a predetermined precharge potential at an initial stage of said read cycle; and
   means for sensing a state of said first memory cell in said read cycle by using a potential of said second and third bit lines, connected to each other, that is lowered from said precharge potential by a drain current drained from said second and third bit lines by at least one of said second and third memory cells.

13. The non-volatile semiconductor memory device of claim 12,
   wherein said second and third bit lines, connected to each other, have a load capacitance twice as large as that of said first bit line.

14. The non-volatile semiconductor memory device of claim 12, further comprising:
   a fourth memory cell that includes a control gate, a floating gate, a drain and a source and is set either to an erase state having a low threshold voltage or to a program state where more electrons than in said erase state are stored in the floating gate for attaining a threshold voltage higher than the threshold voltage attained in said erase state;
   a fourth bit line connected to the drain of said fourth memory cell and set to said precharge potential at the initial stage of said read cycle; and
   means for sensing a state of said fourth memory cell in said read cycle by using a potential of said second and third bit lines, connected to each other, that is lowered from said precharge potential by a drain current drained from said second and third bit lines by at least one of said second and third memory cells.

15. The non-volatile semiconductor memory device of claim 14,
   wherein said second and third bit lines, connected to each other, have a load capacitance twice as large as that of said fourth bit line.

16. In a non-volatile semiconductor memory device having:
   first, second and third memory cells, each of which has a control gate, a floating gate, a drain and a source, and is set either to an erase state having a low threshold voltage or to a program state where more electrons than in said erase state are stored in the floating gate for attaining a threshold voltage higher than the threshold voltage attained in said erase state;
   a first bit line connected to the drain of said first memory cell;
   a second bit line connected to the drain of said second memory cell; and
   a third bit line connected to the drain of said third memory cell, a circuit for generating a reference potential comprising:
      means for setting one of said second and third memory cells to said erase state and the other to said program state;
      means for connecting said second bit line to said third bit line in a given read cycle; and
      means for setting said first, second and third bit lines to a predetermined precharge potential at an initial stage of said read cycle,
   wherein a potential of said second and third bit lines, connected to each other, that is lowered from said precharge potential by a drain current drained from said second and third bit lines by at least one of said second and third memory cells is used as a reference potential for sensing a state of said first memory cell in said read cycle.

17. The circuit of claim 16,
   wherein said second and third bit lines, connected to each other, have a load capacitance twice as large as that of said first bit line.

18. A method of generating a reference potential in a non-volatile semiconductor memory device, said non-volatile semiconductor memory device comprising:

first, second and third memory cells, each of which has a control gate, a floating gate, a drain and a source, and is set either to an erase state having a low threshold voltage or to a program state where more electrons than in said erase state are stored in the floating gate for attaining a threshold voltage higher than the threshold voltage attained in said erase state;

a first bit line connected to the drain of said first memory cell;

a second bit line connected to the drain of said second memory cell;

a third bit line connected to the drain of said third memory cell;

said method of generating said reference potential comprising the steps of:

setting one of said second and third memory cells to said erase state and the other to said program state;

connecting said second bit line to said third bit line in a given read cycle; and setting said first, second and third bit lines to a predetermined precharge potential at an initial stage of said read cycle, wherein a potential of said second and third bit lines, connected to each other, that is lowered from said precharge potential by a drain current drained from said second and third bit lines by at least one of said second and third memory cells is used as a reference potential for sensing a state of said first memory cell in said read cycle.

19. The method of claim 18, further comprising the step of setting load capacitance's of said first, second and third bit lines so that said second and third bit lines, connected to each other, have a load capacitance twice as large as that of said first bit line.

* * * * *